United States Patent
Park et al.

(10) Patent No.: US 10,147,665 B2
(45) Date of Patent: Dec. 4, 2018

(54) POWER MODULE HAVING DUAL-SIDED COOLING

(71) Applicants: HYUNDAI MOTOR COMPANY, Seoul (KR); KIA MOTORS CORPORATION, Seoul (KR)

(72) Inventors: Jun Hee Park, Hwaseong-si (KR); Jeong Min Son, Seongnam-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 15/639,256

(22) Filed: Jun. 30, 2017

(65) Prior Publication Data
US 2018/0174945 A1    Jun. 21, 2018

(30) Foreign Application Priority Data

Dec. 15, 2016  (KR) .......................... 10-2016-0171215

(51) Int. Cl.
*H01L 23/34*    (2006.01)
*H01L 23/10*    (2006.01)
(Continued)

(52) U.S. Cl.
CPC ...... *H01L 23/3735* (2013.01); *H01L 23/3675* (2013.01); *H01L 23/3677* (2013.01);
(Continued)

(58) Field of Classification Search
CPC ............ H01L 23/3735; H01L 23/5381; H01L 25/072; H01L 23/3675; B60L 15/00; H02P 6/085
See application file for complete search history.

(56) References Cited

U.S. PATENT DOCUMENTS

| | | | | |
|---|---|---|---|---|
| 6,975,512 | B1* | 12/2005 | Ooi .................... | H01L 23/4334 165/185 |
| 2009/0116197 | A1* | 5/2009 | Funakoshi .......... | H01L 21/4882 361/719 |
| 2015/0049442 | A1* | 2/2015 | Tani .................... | H05K 1/0204 361/748 |
| 2016/0005676 | A1* | 1/2016 | Orimoto ................ | H01L 24/33 257/714 |

(Continued)

FOREIGN PATENT DOCUMENTS

| | | |
|---|---|---|
| JP | 2008-060531 A | 3/2008 |
| JP | 2010-258315 A | 11/2010 |

(Continued)

OTHER PUBLICATIONS

Korean Office Action dated Jun. 21, 2018 from the corresponding Korean Application No. 10-2016-0171215, 7 pp.

*Primary Examiner* — Ismail A Muse
(74) *Attorney, Agent, or Firm* — Brinks Gilson & Lione

(57) ABSTRACT

A power module having dual-sided cooling is provided with a semiconductor chip between an upper board and a lower board of the power module. In particular, the upper board includes: a first bonding layer made of a dielectric material, and a first electrode made of a copper material and provided on a first surface of the first bonding layer, and the first electrode is connected to the semiconductor chip. The lower board includes: a second bonding layer made of a dielectric material, and a second electrode made of a copper material and provided on a first surface of the second bonding layer, and the second electrode is connected to the semiconductor chip. More specifically, a thickness of the first electrode is greater than a thickness of the first bonding layer, and a thickness of the second electrode is greater than a thickness of the second bonding layer.

8 Claims, 4 Drawing Sheets

100(110,120,130,140)
101(120,130)
200(210,220,230,240,250)
201(220,230,240)

(51) Int. Cl.
*H01L 23/373* (2006.01)
*H01L 23/367* (2006.01)
*H01L 23/538* (2006.01)
*H01L 25/07* (2006.01)
*H01L 23/42* (2006.01)
*H01L 23/473* (2006.01)
*B60L 15/00* (2006.01)
*H02P 6/08* (2016.01)

(52) U.S. Cl.
CPC ............ *H01L 23/42* (2013.01); *H01L 23/473* (2013.01); *H01L 23/5381* (2013.01); *H01L 25/072* (2013.01); *B60L 15/00* (2013.01); *B60L 2240/425* (2013.01); *H01L 2224/33* (2013.01); *H02P 6/085* (2013.01)

(56) References Cited

U.S. PATENT DOCUMENTS

| | | | |
|---|---|---|---|
| 2016/0126157 A1* | 5/2016 | Jeon | H01L 23/4334 257/693 |
| 2016/0163618 A1* | 6/2016 | Tani | H01L 23/367 257/712 |
| 2017/0278774 A1* | 9/2017 | Hayashi | H01L 21/4825 |
| 2018/0102301 A1* | 4/2018 | Jeon | H01L 23/3675 |
| 2018/0211938 A1* | 7/2018 | Tsuyuno | H01L 25/18 |

FOREIGN PATENT DOCUMENTS

KR 10-2016-0050282 5/2016
KR 10-2016-0050282 A 5/2016

\* cited by examiner

POWER MODULE HAVING DUAL-SIDED COOLING

CROSS REFERENCE TO RELATED APPLICATION

The present application claims priority to and the benefit of Korean Patent Application No. 10-2016-0171215, filed Dec. 15, 2016, the entire contents of which is incorporated by reference.

FIELD

The present disclosure relates generally to a power module having dual-sided cooling.

BACKGROUND

The statements in this section merely provide background information related to the present disclosure and may not constitute prior art.

In general, in order to operate a drive motor of a green car such as a hybrid car or an electric car, a power module that appropriately transfers electric current supplied from a high-voltage battery to the drive motor is desired.

Such a power module generates considerable heat due to its fast switching operation. Because this heat generation causes a reduction in efficiency of the power module, a cooler is configured to cool the power module.

In a power module having dual-sided cooling, a board is respectively installed on both surfaces of the semiconductor chip of the power module, i.e., an IGBT or a MOSFET, and coolers are installed at outer sides of the board, thereby simultaneously cooling both sides of the board.

In particular, a 2-in-1 type power module using two semiconductor chips and having dual-sided cooling has a small volume and excellent heat dissipation performance, and thus its application range is expanding.

FIG. 1 shows a conventional 2-in-1 type power module having dual-sided cooling.

As shown in FIG. 1, the conventional power module is configured such that an upper board 10 and a lower board 20 are provided in directions of both sides of a first semiconductor chip 31 and a second semiconductor chip 32, and electrodes such as a first output terminal 11, a second output terminal 12, a third output terminal 23, a positive terminal 22, and a negative terminal 21 that are connected to the semiconductor chips 31 and 32 are provided at the boards 10 and 20. The positive terminal 22 is connected to an anode of a battery (not shown), the negative terminal 21 is connected to a cathode of the battery, and the first, second and third output terminals 11, 12, and 23 are connected to a driving motor (not shown). Spacers 41, 42, 43, and 44 made of a copper material may be provided to connect between the upper board 10 and the lower board 20 and to secure a space for installing wires (not shown).

The electrodes of the upper board 10 and the lower board 20 are respectively provided on insulating layers 14 and 25, and the insulating layers 14 and 25 are made of a ceramic material such as alumina (Al2O3). Further, heat dissipating plates 13 and 24 are provided on outer sides of the insulating layers 14 and 25 to transfer heat to coolers 51 and 52.

Meanwhile, as shown in FIG. 3, heat generated in a semiconductor chip 30 is diffused not only in a lengthwise direction but also in a width direction while being transferred to a copper layer C. Heat is diffused at an angle of about 45° in the copper layer C, which has high thermal conductivity, and is diffused in a vertical direction in an insulating layer I, which has relatively low thermal conductivity.

In order to increase cooling efficiency by increasing a heat dissipation area, it is desired to increase thickness of the copper layer C to form a space where heat is diffused in the width direction. However, in a conventional board composed of copper and ceramic materials, there is a problem in that the copper layer C cannot be formed to a certain thickness or more because of difference in thermal expansion coefficient between copper and ceramic materials. When the copper layer is excessively thick, it is difficult to carry out a process of bonding copper and ceramic layers to each other through a eutectic reaction at a temperature of equal to or greater than 1065° C., and breakage is easily caused due to internal residual stress.

As a solution to this, as shown in FIG. 2, a structure in which a copper-ceramic bonding layer is removed from the board, and insulating layers 96 consisting of silicon nitride (Si3N4) are respectively provided between electrodes 91, 92, 93, and 94 and coolers 51 and 52 has been proposed.

However, we have discovered that since silicon nitride (Si3N4) is relatively expensive and is exposed to the outside of a sealing member 80, it is vulnerable to breakage due to an external impact.

In addition, it is difficult to bond the insulating layers 96 and the electrodes 91, 92, 93, and 94 with a thermal grease 60, and when the thermal grease 60 is not uniformly applied, thermal characteristics are rapidly deteriorated.

The foregoing is intended merely to aid in the understanding of the background of the present disclosure, and is not intended to mean that the present disclosure falls within the purview of the related art that is already known to those skilled in the art.

SUMMARY

The present disclosure provides a power module having dual-sided cooling, and the module adapts a dielectric material, whereby a heat dissipation area can be enlarged.

In one form of the present disclosure, a power module having dual-sided cooling is provided with a semiconductor chip between an upper board and a lower board. The power module comprises: the upper board including a first bonding layer made of a dielectric material, and a first electrode made of a copper material and provided on a first surface of the first bonding layer, the first electrode being connected to the semiconductor chip; and the lower board including a second bonding layer made of a dielectric material, and a second electrode made of a copper material and provided on a first surface of the second bonding layer, the second electrode being connected to the semiconductor chip. In particular, the thickness of the first electrode may be three times or greater than thickness of the first bonding layer, and the thickness of the second electrode may be three times or greater than thickness of the second bonding layer.

The first electrode may include: a first output terminal provided on the first surface of the first bonding layer; and a second output terminal provided on the first surface of the first bonding layer and spaced apart from the first output terminal. The second electrode may include: a positive terminal provided on the first surface of the second bonding layer; a third output terminal provided on the first surface of the second bonding layer and spaced apart from the positive terminal; and a negative terminal provided on the first surface of the second bonding layer and spaced apart from both the positive terminal and the third output terminal.

The semiconductor chip may comprise: a first semiconductor chip provided between the first output terminal and the positive terminal; and a second semiconductor chip provided between the second output terminal and the third output terminal.

A first spacer may be provided between the first output terminal and the first semiconductor chip, and a second spacer may be provided between the second output terminal and the second semiconductor chip.

The first spacer may be configured such that a cross-sectional area of the first spacer increases in a direction from the first semiconductor chip toward the first output terminal, and the second spacer may be configured such that a cross-sectional area of the second spacer increases in a direction from the second semiconductor chip toward the second output terminal.

The positive terminal and the first semiconductor chip, the first semiconductor chip and the first spacer, the first spacer and the first output terminal, the third output terminal and the second semiconductor chip, the second semiconductor chip and the second spacer, and the second spacer and the second output terminal may be respectively soldered together by using a solder material.

A first bridge may be made of a copper material and may connect the first output terminal and the third output terminal to each other, and a second bridge may be made of a copper material and may connect the second output terminal and the negative terminal to each other, wherein the first bridge may be soldered to the first output terminal and the third output terminal by using the solder material, and the second bridge may be soldered to the second output terminal and the negative terminal by using the solder material.

The upper board may further include a first heat dissipating plate being provided on a second surface of the first bonding layer and being in contact with a first cooler, and the lower board may further include a second heat dissipating plate being provided on a second surface of the second bonding layer and being in contact with a second cooler.

A thermal grease may be provided between the first heat dissipating plate and the first cooler, and between the second heat dissipating plate and the second cooler.

Each of the first bonding layer and the second bonding layer may contain 3 to 40 wt % of an epoxy compound and 50 to 95 wt % of ceramic.

The power module having dual-sided cooling according to the present disclosure has the following effects.

First, a thickness of a copper layer can be increased, and thus it is possible to enlarge a heat radiation area.

Second, the heat dissipation area can be enlarged, and thus it is possible to realize improved cooling performance of the power module.

Third, the dielectric material having a higher rigidity than ceramic can be applied, and thus it is possible to prevent breakage.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
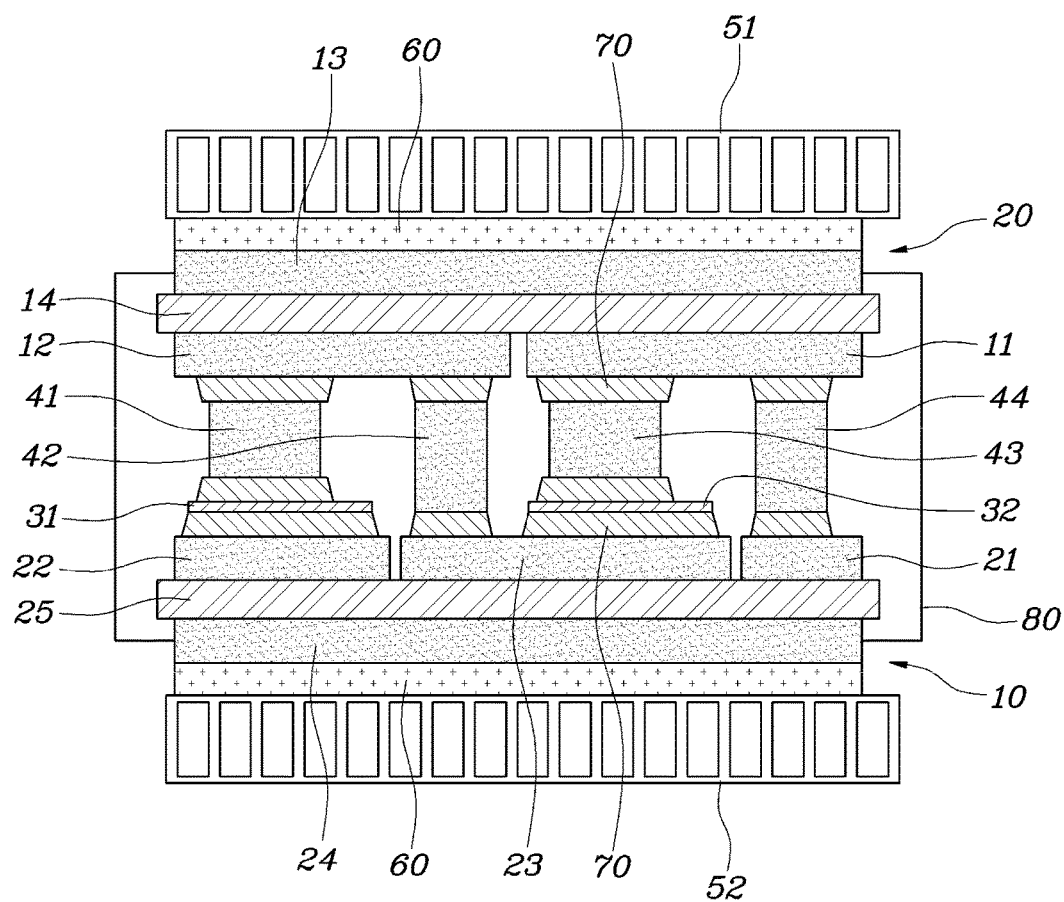
FIG. 1 is a cross-sectional view showing one form of a conventional power module having dual-sided cooling.
Figure 2:
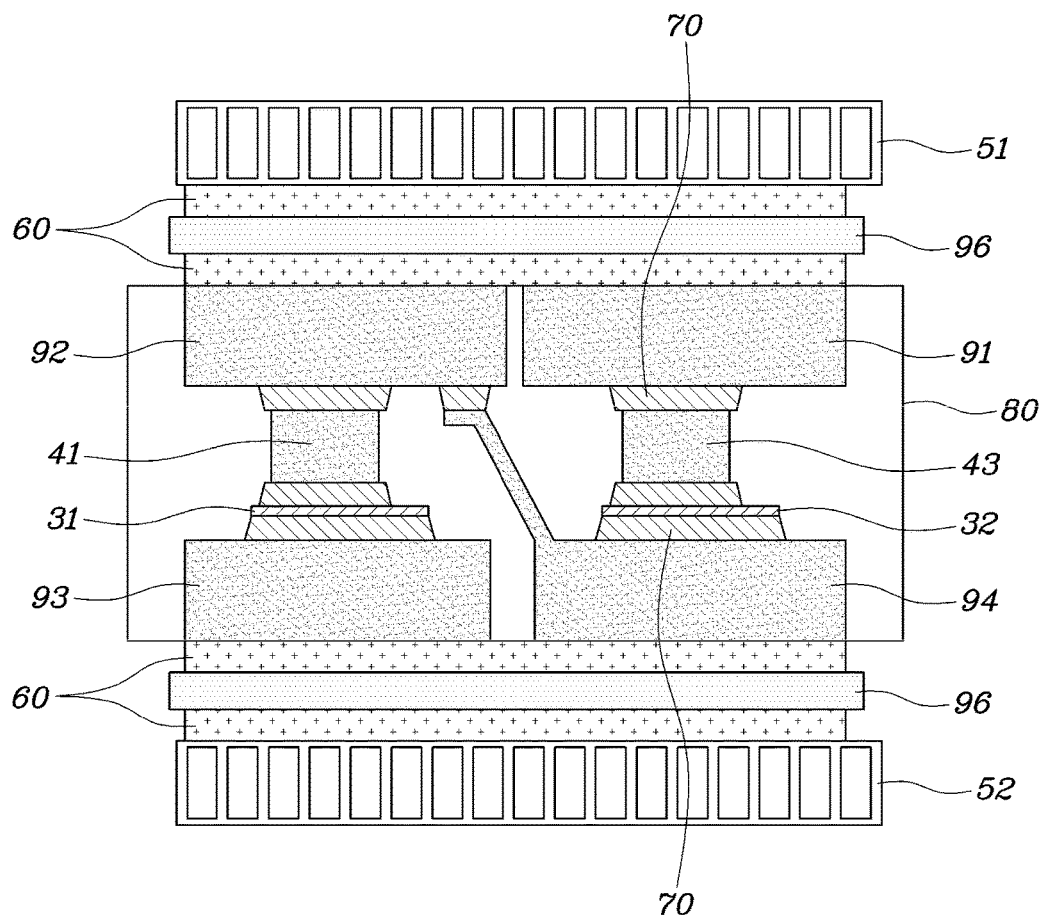
FIG. 2 is a cross-sectional view showing another form of the conventional power module having dual-sided cooling.
Figure 3:
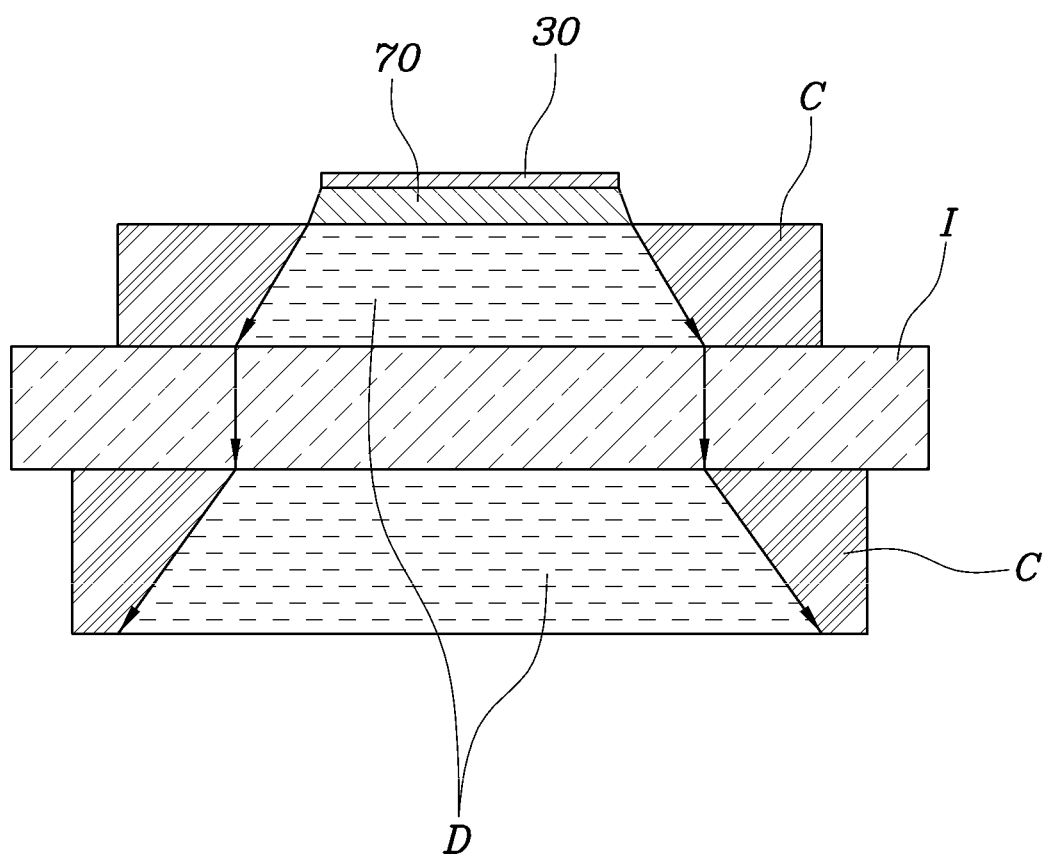
FIG. 3 is a schematic view showing a diffusion direction of heat in a copper material and in a dielectric material.
Figure 4:
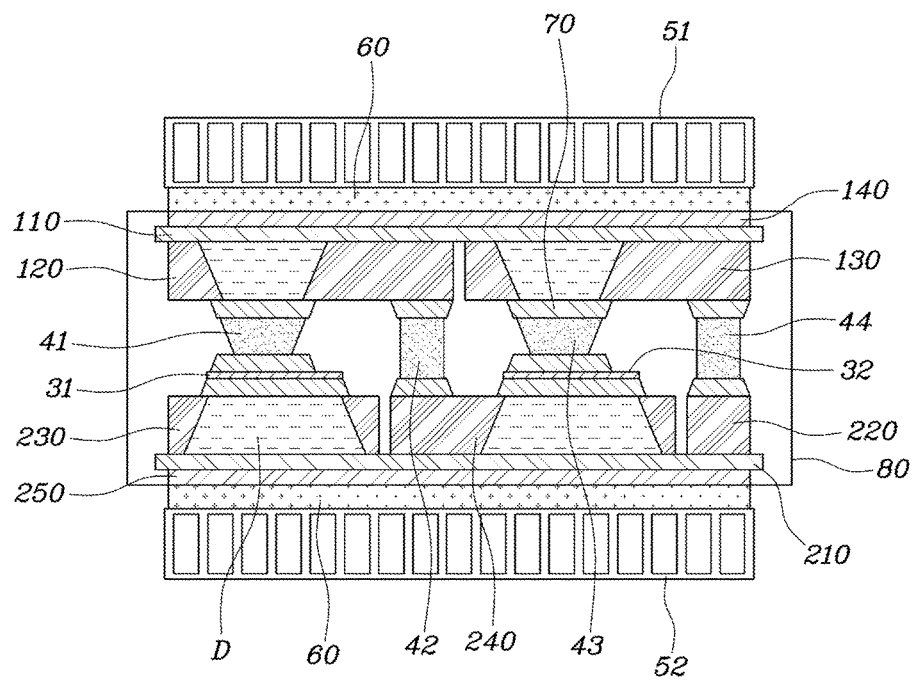
FIG. 4 is a cross-sectional view showing a power module having dual-sided cooling in one form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The terminology used herein is for the purpose of describing particular forms only and is not intended to be limiting. As used herein, the singular forms "a", "an", and "the" are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Hereinafter, a power module having dual-sided cooling in one form of the present disclosure will be described with reference to the accompanying drawings.

The power module having dual-sided cooling in one form of the present disclosure is provided with a semiconductor chip between an upper board and a lower board and comprises: the upper board 100 including a first bonding layer 110 made of a dielectric material, first electrodes 101 made of a copper material, and a first heat dissipating plate 140 made of a copper material; and the lower board 200 including a second bonding layer 210 made of a dielectric material, second electrodes 201 made of a copper material, and a second heat dissipating plate 250 made of a copper material.

Here, a thickness of each of the first electrodes 101 is three times or greater than that of the first bonding layer 110, and a thickness of each of the second electrodes 220, 230 and 240 is three times or greater than that of the second bonding layer 210.

Conventionally, since a copper electrode is bonded to a base layer made of ceramic, namely, an alumina material, thickness of the copper electrode cannot be determined to be higher than a certain level in order to maintain bonding strength. As a result, there is a problem in that a diffusion area of heat is reduced and thus a heat dissipation area is reduced.

However, according to the present disclosure, it is possible to greatly increase thickness of the copper electrode by forming the bonding layer with the dielectric material having toughness to maintain bonding strength even when formed with a small thickness and withstand breakage when a certain degree of deformation occurs.

The first bonding layer 110 and the second bonding layer 210 are made of a dielectric material containing 3 to 40 wt % of epoxy resin and 50 to 95 wt % of ceramic. Here, boron nitride or the like can be used as the ceramic.

The dielectric material of such a composition press bonded at a low temperature of about 180° C. causes a small thermal stress and has excellent elasticity and toughness, thereby preventing breakage due to difference in thermal expansion rate.

Further, each of the first bonding layer 110 and the second bonding layer 210 may have a thickness in a range of 0.04 mm to 0.2 mm. A thickness of at least 0.04 mm is desired to maintain bonding strength and durability as the dielectric material, and a thickness may be equal to or less than 0.2 mm to increase thermal conductivity and to minimize size.

Further, each of the first electrodes 101 and the second electrodes 201 may have a thickness three times or greater than each of the first bonding layer 110 and the second bonding layer 210, and may have a thickness equal to or greater than 0.6 mm. By forming the electrodes with such a thick thickness, it is possible to provide a space D in which heat generated in the semiconductor chips 31 and 32 is diffused in a width direction.

Conventionally, the base layer made of ceramic reacts with the copper electrode at a temperature of equal to or greater than 1065° C. by a eutectic reaction, thereby producing a board. However, in the present disclosure, since the dielectric material is bonded to the copper electrode while being cured at a temperature as low as about 180° C., residual stress is reduced. Moreover, elasticity of the bonding layers 110 and 210 is excellent after completion of manufacture, and thus occurrence of cracks can be reduced or prevented.

The first electrodes 101 comprise a first output terminal 120 and a second output terminal 130, and the second electrodes 220, 230 and 240 comprise a negative terminal 220, a positive terminal 230, and a third output terminal 240.

The first output terminal 120, the second output terminal 130, and the third output terminal 240 are connected to a driving motor (not shown) to supply power. The positive terminal 230 is connected to an anode of a battery (not shown), and the negative terminal 220 is connected to a cathode of the battery, thereby being supplied with power.

The first semiconductor chip 31 is provided between the first output terminal 120 and the positive terminal 230, and the second semiconductor chip 32 is provided between the second output terminal 130 and the third output terminal 240.

In addition, a first bridge 42 connects the first output terminal 120 and the third output terminal 240 to each other, and a second bridge 44 connects the second output terminal 130 and the negative terminal 220 to each other, thereby forming a power structure of the power module.

Although not shown in the drawings, the first spacer 41 and the second spacer 43 are respectively provided between the first output terminal 120 and the first semiconductor chip 31, and between the second output terminal 130 and the second semiconductor chip 32 so as to secure a space in which wires for transmitting/receiving operating signals to the first and second semiconductor chips 31 and 32 are installed. These spacers are made of a copper material to have high heat and electrical conductivity and rigidity.

The first and second spacers 41 and 43 may be formed in a column shape having a constant sectional area, and may be formed in a quadrangular pyramid shape having a trapezoidal side surface.

In other words, the first spacer 41 has the quadrangular pyramid shape such that a cross-sectional area thereof increases from the first semiconductor chip 31 toward the first output terminal 120, and the second spacer 43 has the quadrangular pyramid shape such that a cross-sectional area thereof increases from the second semiconductor chip 32 toward the second output terminal 130.

As described above, since the diffusion direction of heat in the copper material is an angle of about 45°, it is possible to reduce costs and thermal stress by reducing unnecessary material usage by forming a shape of the spacer similarly to the diffusion direction of heat.

The first bonding layer 110 and the first electrodes 101, and the second bonding layer 210 and the second electrodes 201 can be directly bonded to each other by using the dielectric material, but other interfaces are bonded by using a solder material 70. For example, the positive terminal 230 and the first semiconductor chip 31, the first semiconductor chip 32 and the first spacer 41, the first spacer 41 and the first output terminal 120, the third output terminal 240 and the second semiconductor chip 32, the second semiconductor chip 32 and the second spacer 43, and the second spacer 43 and the second output terminal 130 are respectively soldered to each other by using the solder material 70.

In addition, the first bridge 42, the first output terminal 120, and the third output terminal 240, and the second bridge 44, the second output terminal 130, and the negative terminal 220 are respectively soldered to each other by using the solder material 70.

The first heat dissipating plate 140 is installed on an outer surface of the upper board 100, that is, a surface opposite to a surface where the first bonding layer 110 and the first electrodes 101 are bonded to each other. The first electrodes 101 and the first heat dissipating plate 140 may be bonded to the first bonding layer 110 at the same time, or one of the first electrodes 101 and the first heat dissipating plate 140 may be bonded to the first bonding layer 110 first and then a remaining one may be bonded thereto.

Similarly to the first heat dissipating plate 140, a second heat dissipating plate 250 is installed on an outer surface of the lower board 200, that is, a surface opposite to a surface where the second electrodes 201 are bonded to the second bonding layer 210.

The first cooler 51 is installed in the first heat dissipating plate 140 and removes heat generated in the first and second semiconductor chips 31 and 32 and diffused in a direction of the upper board 100. The second cooler 52 is installed in the second heat dissipating plate 250 and removes heat generated in the first and second semiconductor chips 31 and 32 and diffused in a direction of the lower board 200.

A thermal grease 60 may be installed between the first heat dissipating plate 140 and the first cooler 51 and between the second heat dissipating plate 250 and the second cooler 52 to fill gaps therebetween. Thus, heat generated in the first and second semiconductor chips 31 and 32 can be more reliably transmitted to the first and second coolers 51 and 52.

Although a form of the present disclosure has been described for illustrative purposes, those skilled in the art will appreciate that various modifications, additions and substitutions are possible, without departing from the scope and spirit of the present disclosure.

Therefore, forms of the present disclosure have been described for illustrative purposes, and should not be construed as being restrictive. Moreover, the present disclosure is intended to cover not only the exemplary forms, but also various alternatives, modifications, equivalents and other forms that may be included within the spirit and scope of the present disclosure.

What is claimed is:

1. A power module having dual-sided cooling and provided with first and second semiconductor chips between an upper board and a lower board, the power module comprising:
the upper board including a first bonding layer made of a dielectric material, and a first electrode made of a copper material and provided on a first surface of the first bonding layer, the first electrode being connected to the first semiconductor chip;
the lower board including a second bonding layer made of a dielectric material, and a second electrode made of a copper material and provided on a first surface of the second bonding layer, the second electrode being connected to the second semiconductor chip;
a first spacer provided between a first output terminal and the first semiconductor chip; and
a second spacer provided between a second output terminal and the second semiconductor chip,
wherein a thickness of the first electrode is three times or greater than a thickness of the first bonding layer, and a thickness of the second electrode is three times or greater than a thickness of the second bonding layer,
wherein the first spacer is configured such that a cross-sectional area of the first spacer increases in a direction from the first semiconductor chip toward the first output terminal, and the second spacer is configured such that a cross-sectional area of the second spacer increases in a direction from the second semiconductor chip toward the second output terminal; and
wherein the first semiconductor chip and the first spacer, the first spacer and the first output terminal, the second semiconductor chip and the second spacer, and the second spacer and the second output terminal are respectively soldered together by using solder material.

2. The power module of claim 1, wherein the first electrode includes: the first output terminal provided on the first surface of the first bonding layer; and the second output terminal provided on the first surface of the first bonding layer and spaced apart from the first output terminal, and the second electrode includes: a positive terminal provided on the first surface of the second bonding layer; a third output terminal provided on the first surface of the second bonding layer and spaced apart from the positive terminal; and a negative terminal provided on the first surface of the second bonding layer and spaced apart from both the positive terminal and the third output terminal.

3. The power module of claim 2, wherein the first semiconductor chip is provided between the first output terminal and the positive terminal; and the second semiconductor chip is provided between the second output terminal and the third output terminal.

4. The power module of claim 3, wherein the positive terminal and the first semiconductor chip, the third output terminal and the second semiconductor chip, are respectively soldered together by using solder material.

5. The power module of claim 3, further comprising:
a first bridge made of a copper material and configured to connect the first output terminal and the third output terminal to each other; and
a second bridge made of a copper material and configured to connect the second output terminal and the negative terminal to each other,
wherein the first bridge is soldered to the first output terminal and the third output terminal by using the solder material, and
the second bridge is soldered to the second output terminal and the negative terminal by using the solder material.

6. The power module of claim 1, wherein the upper board further includes a first heat dissipating plate being provided on a second surface of the first bonding layer and being in contact with a first cooler, and
the lower board further includes a second heat dissipating plate being provided on a second surface of the second bonding layer and being in contact with a second cooler.

7. The power module of claim 6, further comprising a thermal grease provided between the first heat dissipating plate and the first cooler, and between the second heat dissipating plate and the second cooler.

8. The power module of claim 1, wherein each of the first bonding layer and the second bonding layer contains 3 to 40 wt % of an epoxy compound and 50 to 95 wt % of ceramic.

* * * * *